United States Patent [19]

Yamashita

[11] Patent Number: 5,767,562
[45] Date of Patent: Jun. 16, 1998

[54] DIELECTRICALLY ISOLATED POWER IC

[75] Inventor: Akira Yamashita, Yokohama, Japan

[73] Assignee: Kabushiki Kaisha Toshiba, Kawasaki, Japan

[21] Appl. No.: 697,595

[22] Filed: Aug. 27, 1996

[30] Foreign Application Priority Data

| | | | |
|---|---|---|---|
| Aug. 29, 1995 | [JP] | Japan | 7-220759 |
| Jul. 31, 1996 | [JP] | Japan | 8-202166 |

[51] Int. Cl.$^6$ ............................................. H01L 29/784
[52] U.S. Cl. ........................... 257/500; 257/501; 257/524
[58] Field of Search .................................. 257/500, 501, 257/502, 524, 499

[56] References Cited

U.S. PATENT DOCUMENTS

| | | | |
|---|---|---|---|
| 4,935,800 | 6/1990 | Taguchi | 257/520 |
| 5,491,358 | 2/1996 | Miyata | 257/546 |
| 5,512,777 | 4/1996 | Endo | 257/617 |

FOREIGN PATENT DOCUMENTS

| | | | |
|---|---|---|---|
| 3-276770 | 12/1991 | Japan | 257/546 |
| 5-190661 | 7/1993 | Japan | 257/501 |
| 5-259266 | 10/1993 | Japan | 257/525 |

*Primary Examiner*—Donald Monin
*Attorney, Agent, or Firm*—Finnegan, Henderson, Farabow, Garrett & Dunner, L.L.P.

[57] ABSTRACT

A power IC having at least a level shifter for changing the level of an input signal, a high-side driver circuit for driving a predetermined load in accordance with a level changed by the level shifter, the high-side driver circuit being in a floating state, and a reverse current preventing diode for disconnecting a current path from the ground of the level shifter to the reference potential of the high-side driver circuit. The high-side driver circuit and reverse current preventing diode are respectively dielectrically isolated by a dielectric member to prevent insufficient element isolation to be caused by bias conditions. The predetermined reference potential to be connected to an inductive load or the like in the high-side driver circuit can be set to a negative potential. The electrical energy stored in the inductive load or the like can be extracted out and attenuated at high speed via the reference potential set to the negative potential to thereby realize a high speed operation.

22 Claims, 11 Drawing Sheets

DIELECTRICALLY ISOLATED POWER IC

BACKGROUND OF THE INVENTION

1. Field of the Invention

The present invention generally relates to a power IC with a high-side and a low-side circuits configuration. The invention particularly relates to a semiconductor power IC having a floating driver circuit for driving a high-side output element, particularly to a high-side switch circuit, a high-side bridge circuit, and the like of a dielectrically isolated structure.

2. Description of the Related Art

Vigorous developments of power ICs are now under way. A variety of developments of electrical isolation technology, particularly dielectric isolation technology, have been made to brush up the direct wafer bonding technology and the SOI technology, and in the other field, developments of an electrical isolation structure suitable for dealing with a large power are progressing. A semiconductor power IC such as shown in FIG. 1 is known, and the power IC has a driver circuit for driving a high-side output element or a high-side output circuit. The semiconductor device shown in FIG. 1 has a switching element 101 functioning as a level shifter and a high-side driver circuit 111 which has terminals to which a reference potential different from the ground potential of the semiconductor device is applied. The switching element is, for example, a MOSFET, a bipolar transistor (BPT), an IGBT, or a thyristor. The high-side driver circuit 111 is constituted by a resistor 112, an active element 113 such as MOSFET and BPT, a resistor 114, and a driver 115. The high-side driver circuit 111 is of a floating configuration whose potentials changes, isolated from other circuits in a same semiconductor chip. The driver 115 is typically made of a logic circuit such as inverters. The high-side driver circuit 111 of the floating structure is formed in an island semiconductor region 124 and isolated from other semiconductor regions by p-n junction isolation (JI) technology which uses a non-conductive property of a p-n junction under a reverse bias between the region 124 and a p$^+$-type isolation region 121. Specifically, the switching element 101 functioning as a level shifter is formed in another island semiconductor region isolated from the island semiconductor region 124, switches a path between a node N11 and the ground GND in response to an input signal Vin to convert the input signal Vin into a current signal relative to the ground potential GND. The resistor 112 is connected between a power supply potential $V_M$ line and the node N11. The active element 113 is connected between the power supply potential $V_M$ line and a node N12, and the conduction state of the active element 113 is controlled by the potential at the node n11. The resistor 114 is connected between the node N12 and a reference potential $V_S$ line. The input signal Vin is once converted into a current signal relative to the ground GND by the switching element 101, and this current signal is converted into a voltage signal by the resistor 112, active element 113, and resistor 114. Therefore, a signal for outputting a signal Out is generated at the node N12. The driver 115 is connected between the power supply potential $V_M$ line and reference potential $V_S$, and outputs the signal Out in accordance with the potential at the node N12.

FIG. 2 is a schematic cross sectional view for explaining the structure of peripheral circuits of a switching element of a monolithic power IC having the JI structure shown in FIG. 1, in which an npn BPT is used as the switching element 101. For p-n junction isolation, each element is formed in an n-type region 124, 125, . . . surrounded by a p-type supporting substrate 120 and an element isolation p$^+$-type region 121. The n-type region 124, 125, . . . of an element forming region is applied with a positive potential relative to the p$^+$-type isolation region 121 and p-type supporting substrate 120 so that a parasitic diode 901 is biased reversely. The non-conductive property of the reversely biased parasitic diode is used for element isolation so that the n-type region 125 with the switching element (npn BPT) 101 being formed therein is electrically isolated from other element regions.

The semiconductor device shown in FIG. 1 is connected to a predetermined load circuit to drive an active element of the load circuit. Depending upon the requirements of high speed switching of a power semiconductor element of the load circuit connected to the semiconductor device, it is desired sometimes to extract electric charges out of the load circuit by setting the reference potential $V_S$ of the high-side driver circuit 111 to a negative potential. For example, a power semiconductor element for driving an inductive load cannot turn off at high speed unless the electrical energy stored in the inductive load is attenuated. However, since the conventional high-side driver circuit 111 shown in FIG. 2 is isolated by the JI technology, if the n-type region 124 is set to a potential lower than the ground potential GND, a parasitic thyristor 902 is latched up with a forward bias and the element isolation becomes impossible, which may result in an inability of controlling the high-side driver circuit or in a breakage thereof. Therefore, the reference potential $V_S$ of the high-side driver circuit 111 of the JI structure shown in FIG. 2 cannot be lowered to be a negative value and the high speed operation is difficult.

In order to solve this problem, a method of isolating a high-side driver circuit from other semiconductor regions by dielectric isolation (DI) has been proposed as disclosed, for example, in Japanese Patent Laid-open Publication No. 5-190661. FIG. 3 is a cross sectional view showing the structure of a semiconductor device disclosed in this Publication. In FIG. 3, reference numeral 51 represents a supporting substrate, reference numeral 52 represents an insulating film (dielectric member) for separating elements formed over the supporting substrate 51, and reference numeral 54 represents an isolation region made of high resistance polysilicon or the like for isolating each island semiconductor region 201. A short life time region 201a for preventing element malfunction is formed between semiconductor elements and circuits formed in the island semiconductor regions 201. Of circuits including the high-side driver circuit having terminals for reference potentials different from the ground potential of the device, the circuits having the same reference potential are formed in one dielectrically isolated island semiconductor region 201. As compared to the JI structure in which the non-conducting characteristic of a reversely biased p-n junction diode is used for isolation between elements, the DI structure perfectly isolates elements by the insulating films 52 and 54. The DI structure shown in FIG. 3 has many aspects. For example, if the active layer is relatively thin, a high speed operation is possible, whereas if the active layer is relatively thick, the DI structure can be applied to high breakdown voltage elements and can reduce malfunction to be caused by bias conditions and temperatures.

Also with the high-side driver circuit isolated by DI technology shown in FIG. 3, if the driver circuit has a potential lower than the ground potential, a current path is formed from the ground via the level shifter to the driver circuit and the element isolation becomes impossible similar to the JI technology. As above, the reference potential of a high-side driver circuit with a conventional DI structure cannot be lowered to be negative potential so that the electrical energy of the load circuit cannot be attenuated at high speed. This disadvantage makes it difficult to speed up the operation of a semiconductor device (power IC) even if the DI technology is incorporated.

SUMMARY OF THE INVENTION

The invention has been made in order to solve the above conventional problems. An object of the present invention is to provide a monolithic power IC having a structure capable of achieving element isolation without any practical difficulties even if the reference potential of a high-side driver circuit is set negative.

Another object of the present invention is to provide the structure of a power IC capable of easily set a predetermined reference potential of a driver circuit formed in an element isolated semiconductor active region, to a negative potential, the structure allowing the electrical energy of a load circuit to attenuate at high speed. This novel structure of a monolithic power IC is provided for attenuating at high speed the electrical energy in a load circuit, particularly a high-side switching circuit or half bridge circuit having an inductive load, and allowing a high speed switching.

In order to achieve the above objects, the present invention provides a power IC having at least first to third semiconductor active regions which comprises: as illustratively shown in FIGS. 4 and 5, a level shifter 11 formed in the first semiconductor active region for changing a level of an input signal; a first driver circuit (high-side driver circuit) 10 formed in the second semiconductor active region for driving a predetermined load in accordance with a level changed by the level shifter, the first driver circuit having a reference potential line $V_S$, a power supply line $V_M$ connected to a first power source, and an output line Out; and a reverse current preventing diode 12 formed in the third semiconductor active region and connected between the level shifter 11 and the first driver circuit 10. An aspect of the invention resides in that two regions among the first to third semiconductor active regions are dielectrically isolated from the remaining one region, and that the second semiconductor region is in a floating configuration. In order to discriminate between the high-side driver circuit and a second driver circuit (low-side driver circuit) 73a shown in FIG. 10, the high-side driver circuit is called "the first driver circuit". Obviously, only the first driver circuit without the second driver circuit functions as the constituent element of the invention.

As illustratively shown in FIGS. 7 and 8 in more particular, a high-side switching circuit comprises an output element 61 having first main electrode terminal connected to a second power source 60, second main electrode terminal connected to a load 62, and a control electrode terminal, wherein the output terminal 23 of the first driver circuit 10 is connected to the control electrode terminal, and the reference potential $V_S$ of the first driver circuit 10 is connected to the second main electrode terminal. As illustratively shown in FIGS. 9 and 10, a half bridge circuit comprises: a high-side output element 71 having first main electrode terminal connected to a second power source 70, second main electrode terminal, and a first control electrode terminal; a low-side output element 72 connected to the second main electrode terminal of the high-side output element 71 and having third and fourth main electrode terminal and a second control terminal and an inverter circuit 73 or a low-side driver circuit 73a connected to the second control electrode terminal.

In the power IC of the invention, the driver circuit 10 and reverse current preventing diode 12 are formed in electrically independent island semiconductor regions isolated by a dielectric member. Therefore, even if the reference potential of the high-side driver circuit is set to a negative potential, forward current of a parasitic p-n junction diodes, forward current of a parasitic thyristor, or "the latch-up current" will not exist which otherwise exist as in the case of JI structure. Accordingly, stable isolation is possible irrespective of any bias conditions. Since the reverse current preventing diode is inserted between the driver circuit and level shifter, a current path from the ground to the reference potential of the driver circuit will not be formed even if the reference potential of the driver circuit is set to a negative potential. The reference potential of the driver circuit in the floating state can therefore be set to a desired negative potential if it is lower than the breakdown voltage of the reverse current preventing diode.

For the high-side switching circuit having an inductive load 62 as in the case of FIGS. 7 and 8, when the output element 61, 61a is turned off, the electrical energy stored in the load 62 can be pulled out and attenuated rapidly by setting the reference potential line $V_S$ to a negative potential. Namely, by dielectrically isolating at least two among the driver circuit 10, reverse current preventing diode 12, and level shifter 11, the potential of the driver circuit 10 can be changed to a desired value without adversely affecting the other circuit elements constituting the power IC. Bias setting and design of the power IC can be made easily while realizing high speed turn-off of the output element 61, 61a connected as a load of the power IC or built in the power IC.

Other and further objects and features of the present invention will become obvious upon an understanding of the illustrative embodiments about to be described in connection with the accompanying drawings or will be indicated in the appended claims, and various advantages not referred to therein will occur to one skilled in the art upon employing of the invention in practice.

BRIEF DESCRIPTION OF THE DRAWINGS

FIG. 7 is a diagram showing the outline of a high-side switching circuit using the high-side driver circuit shown in FIG. 4 and the like.

DETAILED DESCRIPTION OF THE EMBODIMENTS

Figure 1:
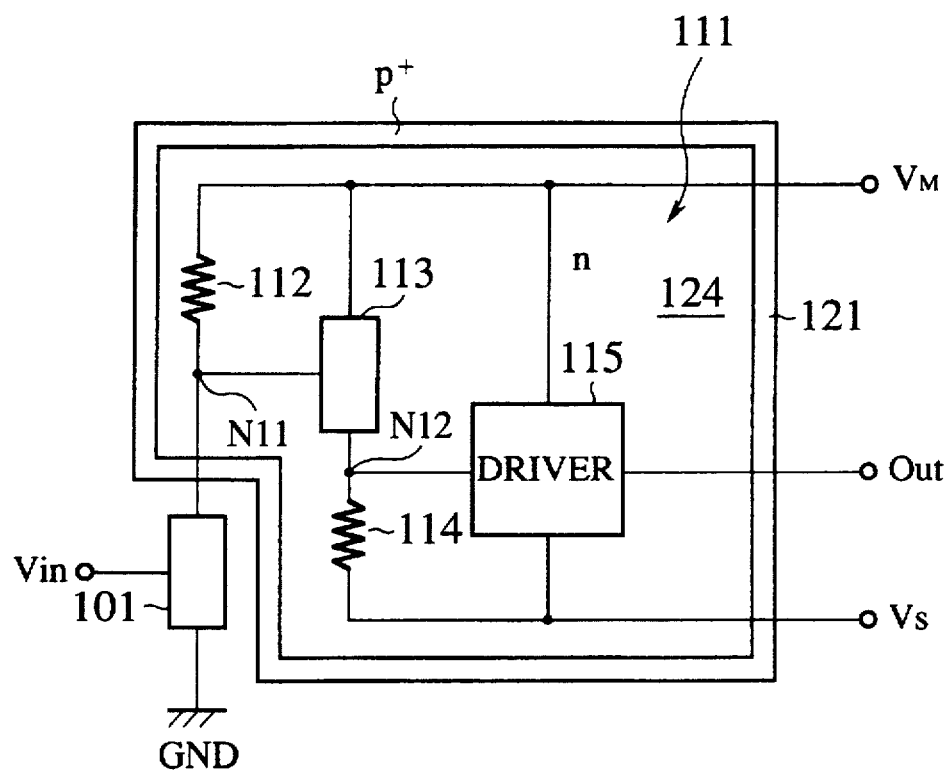
FIG. 1 is a schematic diagram showing the structure of a power IC having a conventional junction isolation (JI) structure.
Figure 2:
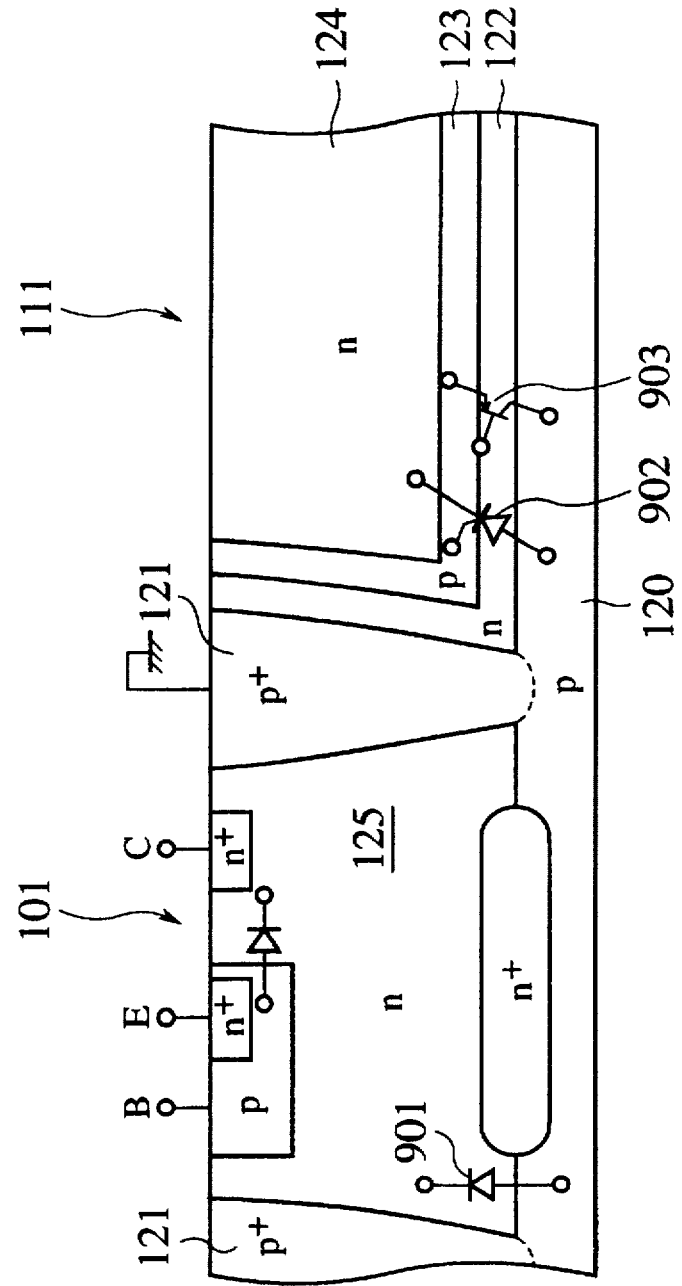
FIG. 2 is a cross sectional view of the power IC shown in FIG. 1.
Figure 3:
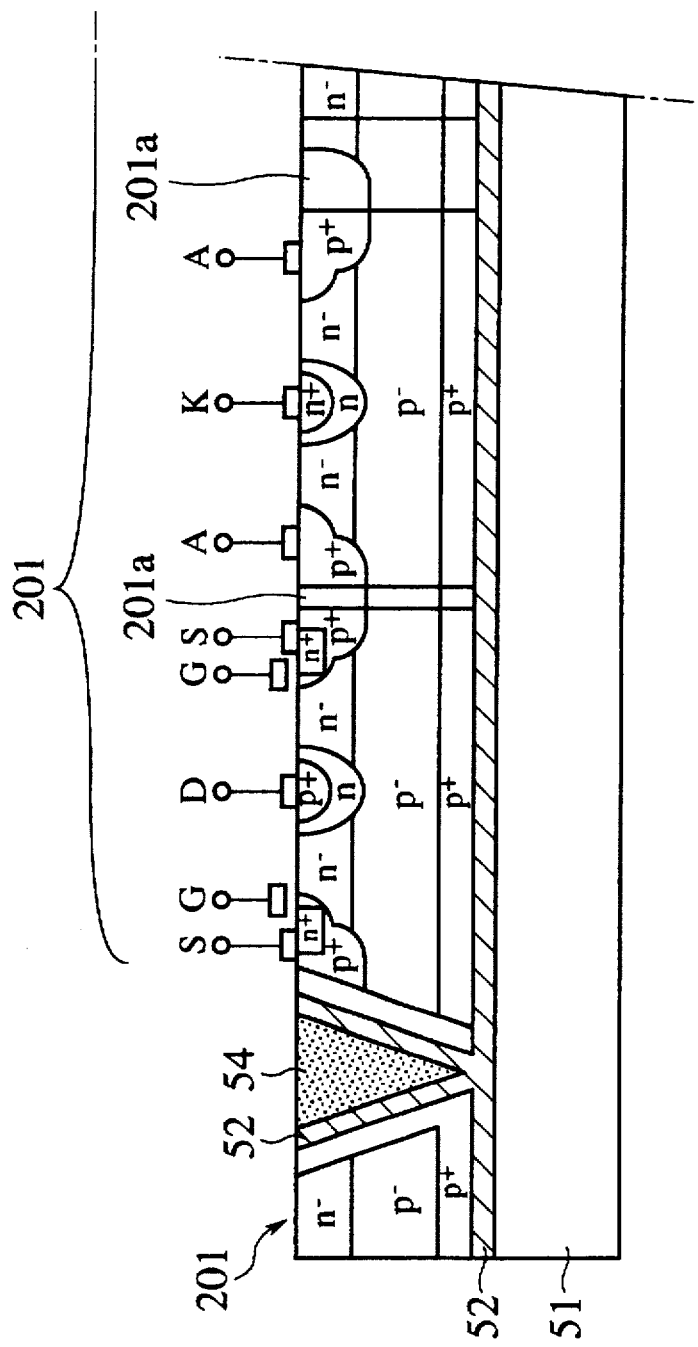
FIG. 3 is a cross sectional view showing the structure of a power IC having a conventional dielectric isolation (DI) structure.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally and as it is conventional in the representation of semiconductor devices, it will be appreciated that the various drawings are not drawn to scale from one figure to another nor inside a given figure, and in particular that the layer thicknesses are arbitrarily drawn for facilitating the reading of the drawings.

(1st Embodiment)

Figure 4:
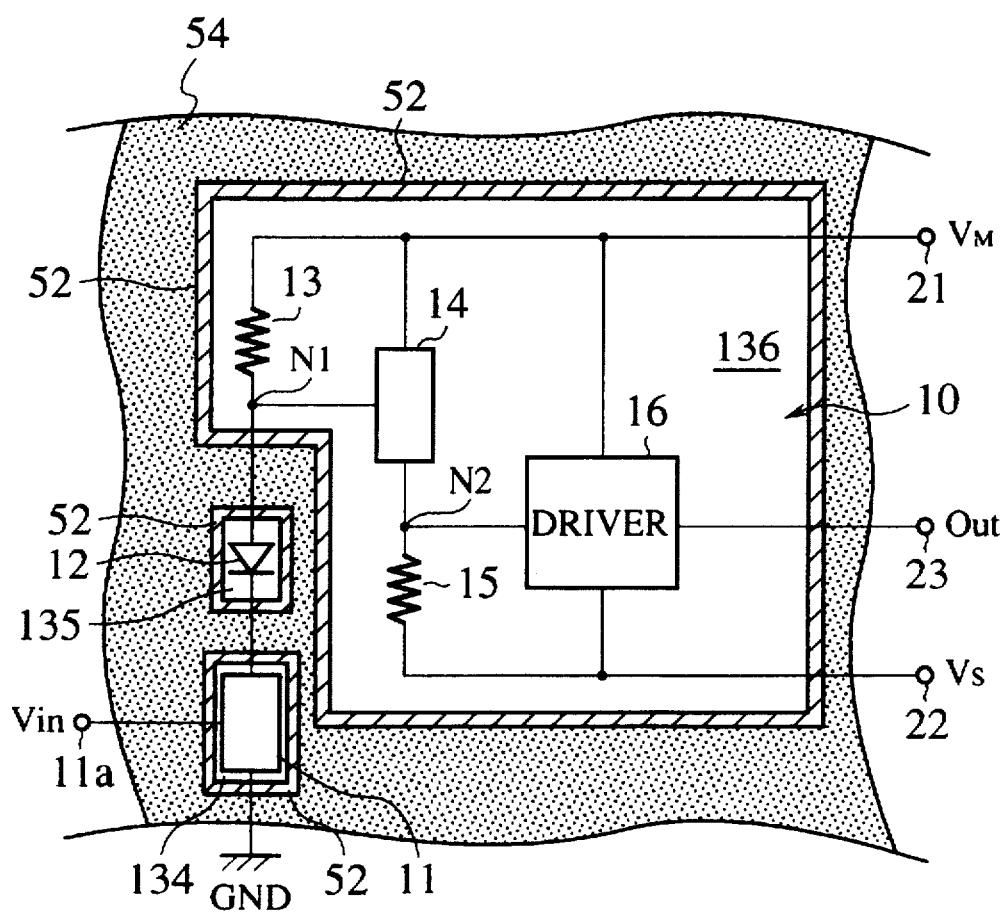
FIG. 4 is a diagram showing the structure of a high-side driver circuit and the like according to a first embodiment of the invention.

FIG. 4 is a schematic diagram showing the structure of a power IC according to the first embodiment of the invention. The first embodiment of the invention pertains to a high-side switching circuit shown in FIGS. 7 and 8. Prior to the description of the high-side switching circuit, a high-side driver circuit and its peripheral circuits will first be described. Although the objects of the invention can be achieved if the device has at least two element isolated active regions, the power IC shown in FIG. 4 has three active regions 134, 135, and 136 which are isolated by dielectric isolation regions 52, 54. In the active region 136 a high-side driver circuit 10 is formed having a terminal to which a reference potential different from the ground potential of the device is applied. This semiconductor device is different from a conventional high-side driver circuit in that the high-side driver circuit of a floating configuration is formed in the island semiconductor active region 136 isolated by dielectric isolation, that a reverse current preventing diode 12 is inserted into a path to a switching element 11 functioning as a level shifter for the high-side switching, the reverse current preventing diode 12 being inserted as part of the level shifter, and that the diode is formed in the dielectrically isolated island semiconductor active region 135 different from the active region 136.

Specifically, the switching element 11 switches the path between the reverse current preventing diode 12 and ground GND in response to an input signal Vin applied to an input terminal 11a. The anode of the reverse current preventing diode 12 is connected to an input node N1 of the high-side driver circuit 10. The high-side driver circuit 10 has a power supply potential $V_M$ terminal 21, a reference potential $V_S$ terminal 22, and an output signal Out terminal 23. The high-side driver circuit 10 is constituted by a resistor 13, an active element 14, a resistor 15, and a driver 16. The resistor 13 is connected between the power supply potential $V_M$ terminal 21 and the node N2. The active element 14 such as a pnp BPT and a MOSFET is connected between the power supply potential $V_M$ terminal 21 and a node N2 and functions as an element for receiving a level shifted by the level shifter, the conduction state of the active element being controlled by the potential at the node N1. The resistor 15 is connected between the node N2 and the reference potential $V_S$ terminal 22. The driver 16 is connected between the power supply potential $V_M$ terminal 21 and reference potential $V_S$ terminal 22 and outputs the signal Out from the output terminal 23 in response to the potential at the node N2.

Figure 5:
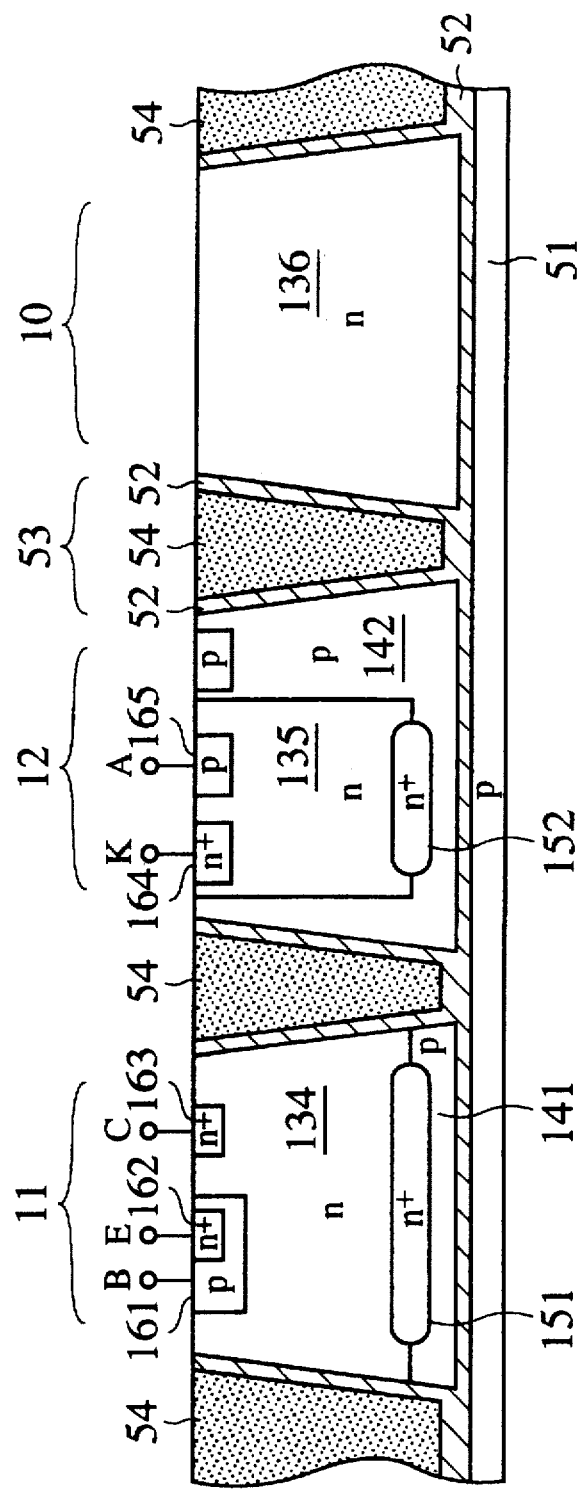
FIG. 5 is a cross sectional view of the high-side driver circuit shown in FIG. 4.

FIG. 5 is a cross sectional view explaining the dielectric isolation (DI) structure of the power IC shown in FIG. 4. Since the structure of the high-side driver circuit 10 is complicated, it is not specifically drawn in FIG. 5. On a supporting substrate 51 of monocrystal, polycrystal of semiconductor or dielectrics such as $SiO_2$, sapphire ($Al_2O_3$), an insulating film (dielectric member) 52 of $SiO_2$ or the like for element isolation is formed, and on this insulating film 52, electrically independent n-type island semiconductor active regions 134, 135, and 136 are formed. The active region 135 is surrounded by a p-type region 142. At the bottoms of the n-type active regions 134 and 135, $n^+$-type buried regions 151 and 152 are formed. In these island active regions 136, 135, and 134, the high-side driver circuit 10 with its details being not drawn, reverse current preventing diode 12, and switching element 11 are separately formed. Specifically, the bottoms of the island semiconductor active regions 134, 135, and 136 are covered with the insulating film 52, and element isolation regions 53 are formed at respective isolation boundaries. The $n^+$-type buried regions 151 and p-type region 141 formed at the bottoms of the n-type active regions 134 may be omitted in some cases. Similarly, the $n^+$-type buried region at the bottom of the n-type active region 135 and the p-type region 142 may be omitted. The element isolation region 53 is constituted by an insulating film 52 formed on the side wall of a V-shaped groove and high resistivity polysilicon 54 buried inside the groove. Instead of the V-groove, a U-groove or an inverted V-groove may be formed with the insulating film 52 and polysilicon 54 being buried inside the groove.

In operation of the power IC shown in FIGS. 4 and 5, as an turn-on input signal Vin is applied to the input terminal 11a and the switching element 11 turns on, current flows from the power supply potential $V_M$ terminal 21 via the resistor 13 and diode 12, and the potential at the node N1 lowers to turn on the active element 14. The electrical characteristics of this active element are so selected that the above operation can be reliably performed. The active element 14 is preferably a p-channel MOSFET or a pnp bipolar transistor (BPT). As the active element 14 turns on, current flows from the power supply potential $V_M$ terminal 21 into the resistor 15 to raise the potential at the node N2. As a result, the driver 16 turns on and outputs a signal Out of "H" level from the output terminal 23. The driver 16 is so designed that the above operation can be reliably performed. Namely, the driver 16 uses an active element such as an inverter which can turn on when the potential of the node N2 rises.

As a turn-off input signal Vin is applied to the input terminal 11a and the switching element 11 turns off, the potential of the node N1 rises to turn off the active element 14. As the active element 14 turns off, the potential of the node N2 lowers so that the driver 16 turns off and outputs a signal Out of "L" level from the output terminal 23. Namely, the input signal Vin is once converted by the switching element 11 into a current signal relative to the ground potential GND, and then converted into a voltage signal by a combination of the resistor 13, active element 14, and resistor 15. Accordingly, a voltage for the output signal Out appears at the node N2 and drives the driver 16.

Figure 6A:
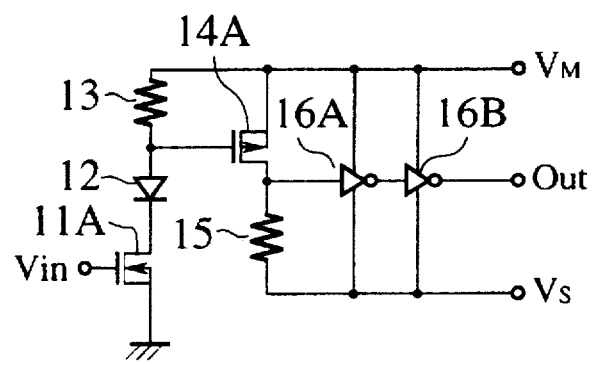
FIGS. 6A to 6G are circuit diagrams showing particular examples of power ICs according to the first embodiment of the invention.
Figure 6B:
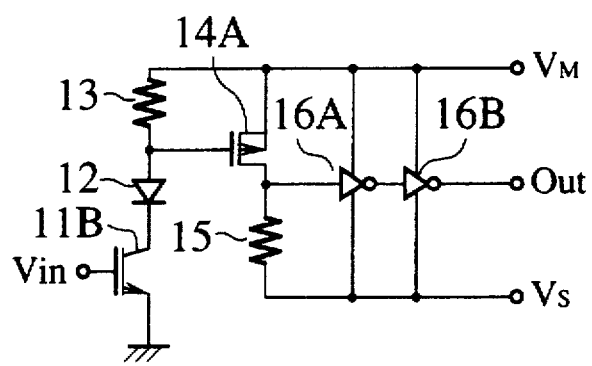
Figure 6C:
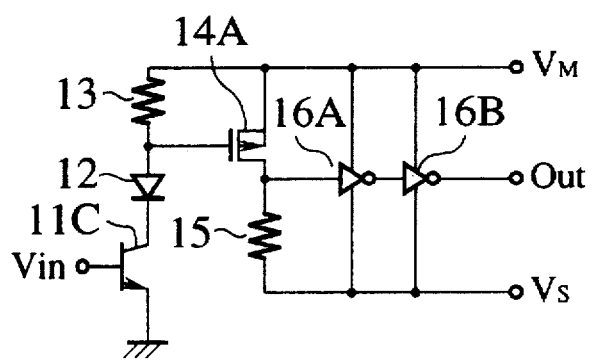
Figure 6D:
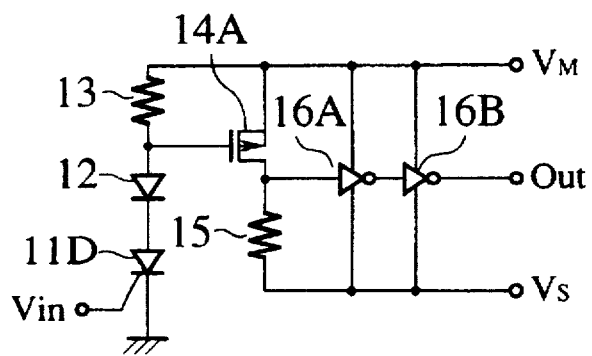
Figure 6E:
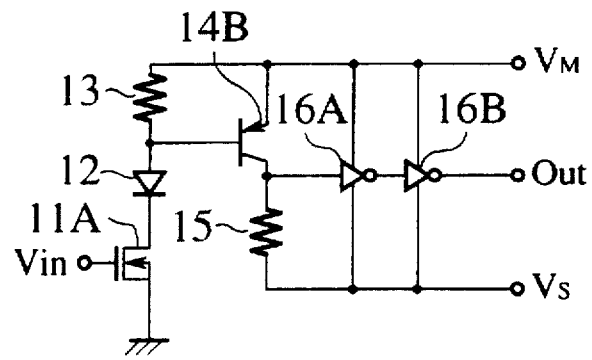
Figure 6F:
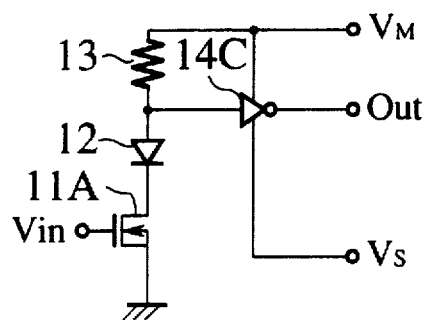

FIGS. 6A to 6G are circuit diagrams showing particular examples of power ICs each constituted by the high-side driver circuit, reverse current preventing diode, and switching element. Like elements to those shown in FIG. 4 are represented by using identical or similar reference numerals and symbols. In the power ICs shown in FIGS. 6A to 6D, the switching element 11 of the semiconductor device shown in FIG. 4 is replaced by an n-channel MOSFET 11A, an IGBT 11B, an npn transistor 11C, and a thyristor 11D, respectively, the active element 14 is replaced by a p-channel MOSFET 14A, and the driver 16 is replaced by inverter circuits 16A and 16B connected in tandem. In the power IC shown in FIG. 6E, the active element 14 shown in FIG. 4 is replaced by a pnp BPT 14B, and in the power IC shown in FIG. 6F, the active element 14 of the semiconductor device shown in FIG. 4 is replaced by a CMOS inverter 14C, and the resistors 15 and driver 16 are omitted. Even if the resistor 15 and driver 16 are omitted as shown in FIG. 6F, the same functions and effects as the semiconductor device shown in FIG. 4 can be obtained.

Figure 6G:
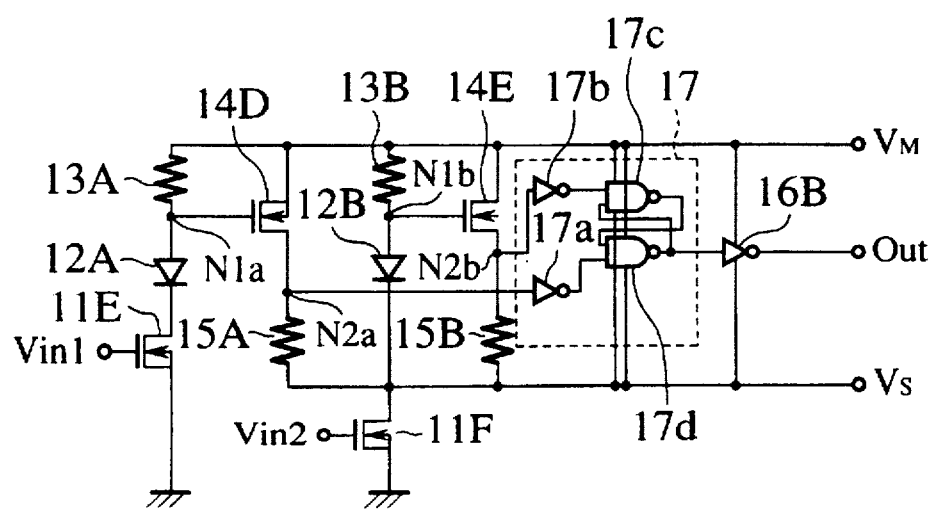

In the semiconductor device shown in FIG. 6G, in order to reduce current dissipation, two input configuration is used and a latch operation is performed in the high-side driver circuit 10 to output a signal Out. Specifically, two input configuration is provided by using the fundamental structure shown in FIG. 6A. The two input series are constituted by switching elements of n-channel MOSFETs 11E and 11F (corresponding to the switching element 11A), reverse current preventing diodes 12A and 12B (corresponding to the reverse current preventing diode 12), resistors 13A and 13B (corresponding to the resistor 13), p-channel MOSFETs 14D and 14E (corresponding to the p-channel MOSFET 14A), and resistors 15A and 15B (corresponding to the resistor 15). Nodes N2a and N2b (corresponding to the node N2) are connected to a latch circuit 17. The latch circuit 17 is constituted by inverter circuits 17a and 17b, and NAND gates 17c and 17d, the nodes N2a and N2b being connected to the input sides of the inverter circuits 17a and 17b. An inverter circuit 16B is connected to the output side of the latch circuit 17, and outputs a signal Out. The fundamental operations and effects of this semiconductor device are the same as the device shown in FIG. 6A. However, current dissipation can be reduced because the input signals Vin 1 and Vin 2 are supplied only when the storage data in the latch circuit 17 is to be changed and the input signals are not necessary to be supplied in the other case.

Figure 7:
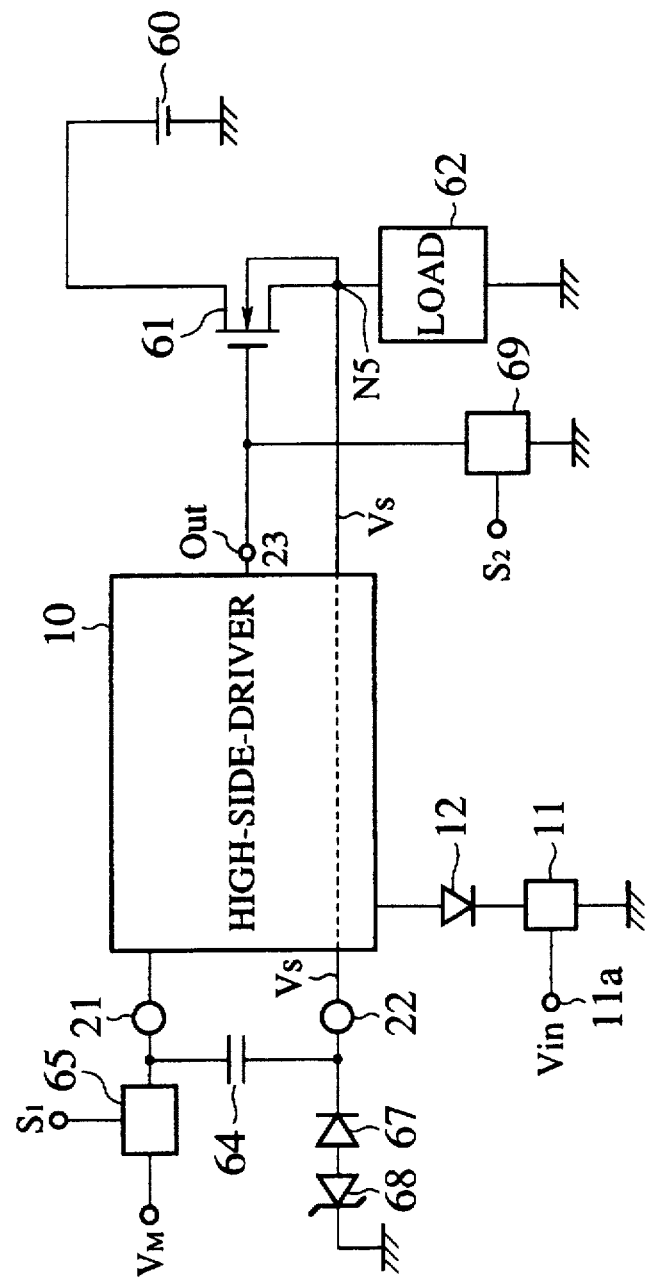

Next, a high-side switching circuit using the high-side driver circuit constructed as above will be described. FIG. 7 is a schematic diagram showing the outline of a high-side switching circuit using the high-side driver circuit shown in FIG. 4 including the high-side driver circuit 10, reverse current preventing diode 12, and switching element 11. This high-side switching circuit has an output element 61 constituted by an n-channel MOSFET whose drain is connected to a power source 60 and source is connected via an output node N5 to a load 62. The output "Out" 23 of the high-side driver circuit 10 is applied to the gate of the output element 61, and the reference potential $V_S$ is applied to the node N5. The output element 61 is not limited only to the n-channel MOSFET, but obviously other power semiconductor elements may also be used including a BPT, an IGBT, a thyristor, a GTO, a SIT, and an SI thyristor. In the high-side switching circuit of the first embodiment of the invention, a capacitor 64 is connected between the power supply potential $V_M$ line and reference potential $V_S$ line. A power source $V_M$ is connected via a first switching element 65 to the power supply potential $V_M$ line, and the reference potential $V_S$ line is connected to the ground GND via a diode 67 and a Zener diode 68 respectively reversely connected. A second switching element 69 is connected between the gate of the n-channel MOSFET 61 and the ground GND. The first and second switching elements 65 and 69 constitute "negative potential setting means" for lowering the potential of the high-side driver circuit 10 in the floating state and setting its reference potential $V_S$ line to a negative potential.

With this high-side switching circuit, during an normal state, i.e., during a conductive state of the output element 61, a signal S1 of "H" level is applied to the gate of the first switching element 65 and a signal S2 of "L" level is applied to the gate of the second switching element 69, so that the first switching element 65 in an on-state and the second switching element 69 is in an off-state. Therefore, during the normal state, the capacitor 64 is charged by the potential between the power source potential $V_M$ and reference potential $V_S$. In this state, as a turn-on input signal Vin is applied to the input terminal 11a, the high-side drive circuit 10 enters an active state and outputs a signal Out of "H" level from the output terminal 23. Therefore, the n-channel MOSFET 61 turns on and current flows from the power source 60 to the load 62. Conversely, as a turn-off input signal Vin is applied to the input terminal 11a, the high-side drive circuit 10 enters a disabled state and outputs a signal Out of "L" level from the output terminal 23. Therefore, the n-channel MOSFET 61 enters a high resistance state and the current supply from the power source 60 to the load 62 is blocked. Even if the current supply to the load 62 is blocked, the output element 61 does not take a perfect turn-off state until the energy flowed into the load 62 is attenuated. In order to turn off the output element 61 at high speed, it is necessary to attenuate the energy in the load 62 speedily. To this end, according to the first embodiment, in order to extract the electrical energy, i.e., carriers, out of the load 62, the reference potential VS of the high-side driver circuit 10 is set to a negative potential.

Specifically, in the first embodiment of the invention, the reference potential $V_S$ of the high-side driver circuit 10 is set to a negative potential to attenuate the energy in the load 62 quickly and turn off the n-channel MOSFET 61 at high speed. To this end, first, the signal S1 is set to "L" level to turn off the first switching element 65 so that a supply of energy is stopped and the high-side driver circuit is made to be in a floating state. Next, the signal S2 is set to "H" level to turn on the second switching element 69 so that a parasitic capacitor between the gate and source of the n-channel MOSFET 61 is discharged quickly, and the potential barrier in the channel of the n-channel MOSFET 61 is raised to stop injection of electrons into the channel. At the same time, the potential of the signal "Out" of the high-side driver circuit 10 is lowered and the whole potential of the high-side drive circuit in the floating state is lowered. As a result, owing to the charges in the capacitor 64, the reference potential VS line takes a negative potential in a spike manner.

It is to be noted here that a conventional high-side driver circuit cannot make the reference potential VS take a negative potential because the element isolation becomes insufficient by the operation of parasitic elements in the JI structure or the generation of current paths. In contrast, according to the first embodiment of the invention, as shown in FIGS. 4 and 5, the high-side driver circuit 10 is formed in the dielectrically isolated single island semiconductor region 136, the reverse current preventing diode 12 is inserted into the switching current path of the switching element 11 constituting the level shifter, and the reverse current preventing diode 12 is also formed in the other dielectrically isolated island semiconductor region 135. Therefore, element isolation can be maintained irrespective of the state of bias conditions so that diode forward current (in the JI structure) will not flow and a current path from the ground GND to the reference potential $V_S$ line (as in the case of the prior art DI structure) will not be formed. According to the first embodiment of the invention, therefore, the reference potential $V_S$ line can be lowered down to the breakdown voltage of the reverse current preventing diode 12, and the energy in the load 62 can be attenuated quickly to realize a high speed switching.

Figure 8:
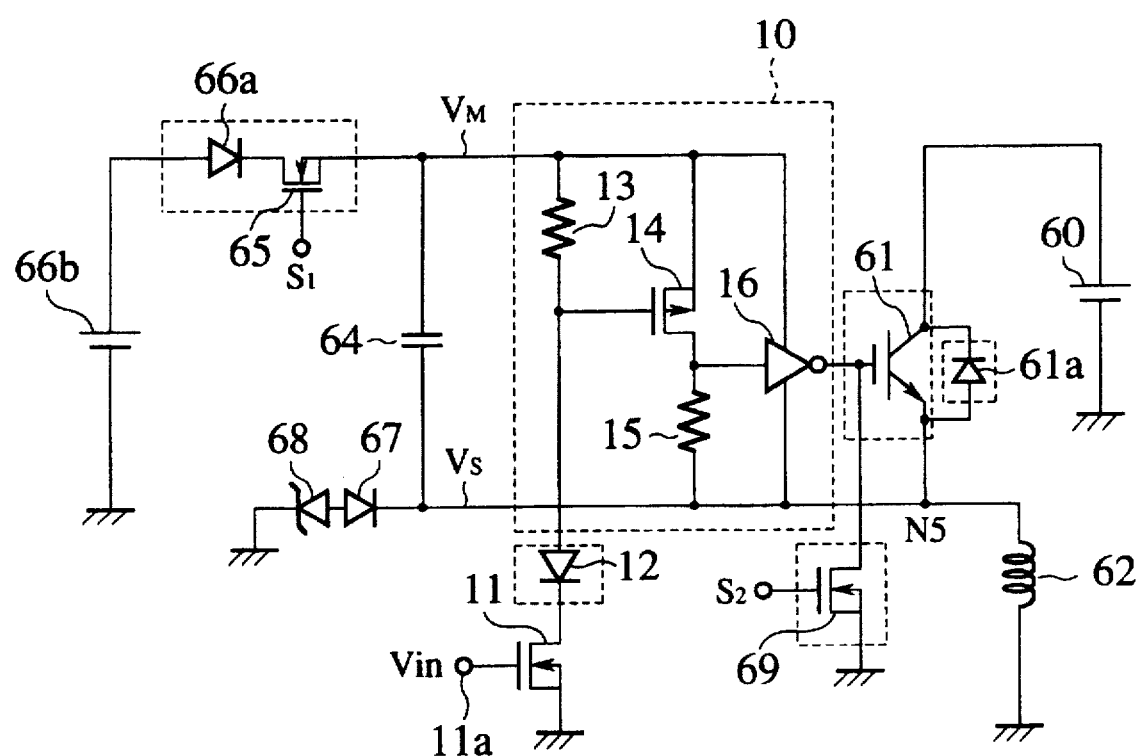
FIG. 8 is a diagram showing a particular circuit arrangement of another high-side driver circuit according to the first embodiment of the invention.

FIG. 8 is a circuit diagram of another high-side switching circuit according to the first embodiment of the invention, the circuit diagram showing the more detailed structure than that shown in FIG. 7. In FIG. 8, like elements to those shown in FIGS. 4 and 7 are represented by using identical reference numerals. As different from the circuit shown in FIG. 7, this high-side switching circuit uses an IGBT as the output element 61 and a clamping diode 61a is connected in parallel to the output element 61. In addition, a capacitor 64 is connected between the power supply potential $V_M$ line and reference potential $V_S$ line. The power supply potential $V_M$ line is connected via the first switching element 65 to a power supply circuit with a diode 66a and a power source 66b sequentially connected. The reference potential $V_S$ line is connected to the ground GND via the diode 67 and Zener diode 68 respectively reversely connected. The second switching element 69 is connected between the gate of IGBT 61 and the ground GND. The first and second switching elements (n-channel MOSFETs) 65 and 69 constitute negative potential setting means for lowering the potential of the high-side driver circuit 10 in the floating state and setting its reference potential $V_S$ line to a negative potential.

With this high-side switching circuit, during an normal state. i.e., during a conductive state of the output element 61, a signal S1 of "H" level is applied to the gate of the first switching element 65 and a signal S2 of "L" level is applied to the gate of the second switching element 69, so that the first switching element 65 in an on-state and the second switching element 69 is in an off-state. Therefore, during the normal state, the capacitor 64 is charged by the power source 66b. In this state, as a turn-on input signal Vin is applied to the input terminal 11a, the high-side drive circuit 10 enters an active state and current flows from the power source 60 to the load 62. Conversely, as a turn-off input signal Vin is applied to the input terminal 11a, the high-side drive circuit 10 enters a disabled state and the output element 61 turns off to block a current supply from the power source 60 to the load 62.

In this state, according to the first embodiment of the invention, the reference potential $V_S$ of the high-side driver circuit 10 is set to a negative potential to quickly attenuate the energy in the load 62 and turn off the output element 61 at high speed. This approach is similar to that described with FIG. 7. First, the signal S1 is set to "L" level to turn off the first switching element 65 so that a supply of energy is stopped and the high-side driver circuit is made to be in a floating state. Next, the signal S2 is set to "H" level to turn on the second switching element 69 so that a parasitic capacitor between the gate and source of IGBT 61 is discharged quickly, and the potential barrier in the channel of IGBT 61 is raised to stop injection of electrons from the emitter. At the same time, the potential of the signal "Out" of the high-side driver circuit 10 is lowered and the whole potential of the high-side drive circuit in the floating state is lowered. As a result, by the capacitive coupling with the charges in the capacitor 64, the reference potential $V_S$ line takes a negative potential in a spike manner.

According to the first embodiment of the invention, the high-side driver circuit 10, reverse current preventing diode 12, and the like are isolated by DI technology so that isolation between elements can be perfectly maintained irrespective of the bias conditions. Further, since the current path from the ground GND to reference potential $V_S$ line is blocked by the reverse current preventing diode 12, the reference potential $V_S$ can be set to a negative potential as described above. Accordingly, the energy in the load 62 can be attenuated quickly and a high speed operation of the circuit can be realized.

As described so far, in the high-side switching circuit of the first embodiment of the invention, the high-side driver circuit 10 is formed in the dielectrically isolated single island semiconductor region 136, the reverse current preventing diode 12 is inserted into the switching current path of the switching element 11 constituting the level shifter, and the reverse current preventing diode 12 is also formed in the other dielectrically isolated island semiconductor region 135. Therefore, even if the reference potential $V_S$ line is set to a negative potential, parasitic elements will not operate to flow a forward current in a p-n junction diode as in the case of the JI structure, and further a current path is not formed from the ground GND to the reference potential $V_S$ line because the reverse current path is disconnected by the reverse current preventing diode. The reference potential $V_S$ line can therefore be lowered down to the breakdown voltage of the reverse current preventing diode 12 and the electrical energy in the load can be attenuated quickly.

Although the DI structure is one feature of the present invention, the element isolation circuit is not limited to the structure shown in FIG. 4, but the switching element may be isolated by DI structure or only the high-side driver circuit 10 and switching element 11 may be isolated by DI structure. Further, as indicated by a portion surrounded by a broken line in FIG. 8, the output element 61; clamping diode 61a; first switching element 65 and diode 66a connected to this element 65; second switching element 69; and the like may also be isolated by DI technology. In the first embodiment of the invention, in the case that the elements formed over the supporting substrate are three elements including the high-side driver circuit 10, switching element 11, and reverse current preventing diode 12, it is sufficient at least two elements are isolated from the remaining one element by DI structure. With this arrangement, even if the reference potential $V_S$ line is set to a negative potential level lower than the ground GND, parasitic elements between the supporting substrate and the active regions do not operate or a current path will not be formed from the ground GND to the reference potential $V_S$ line. Therefore, the reference potential VS line can be lowered down to the breakdown voltage of the reverse current preventing diode 12 so that the electrical energy in the load can be attenuated quickly and a power IC capable of high speed turn-off can be realized.

In the first embodiment of the invention, it is most preferable that the two elements, the high-side driver circuit 10 and reverse current preventing diode 12, are surrounded by a dielectric member. This is explained as follows. As seen from FIGS. 7 and 8, the elements other than the above-described three elements are formed on the same supporting substrate in the general power IC. Namely, the fundamental concept illustrated in the first embodiment of the invention is applicable to other general power ICs not only to the circuit shown in FIGS. 7 and 8. In such a case, the high-side driver circuit 10 has a potential change range larger than the switching element 11 because the potential of the high-side driver circuit 10 changes approximately between $V_M$ and $V_S$ and the reverse current preventing diode 12 is not directly connected to the ground GND. Accordingly, in the first embodiment of the invention, it is preferable to isolate the two elements of these three elements (the high-side driver circuit 10 and reverse current preventing diode 12). Because if the two elements are respectively isolated by DI technology, the operations of the elements other than the three elements can be normalized most efficiently. In addition to this effect, if the DI region surrounding the other active regions is omitted, the area efficiency can be improved correspondingly so that the total chip area of the power IC can be reduced.

(2nd Embodiment)

Figure 9:
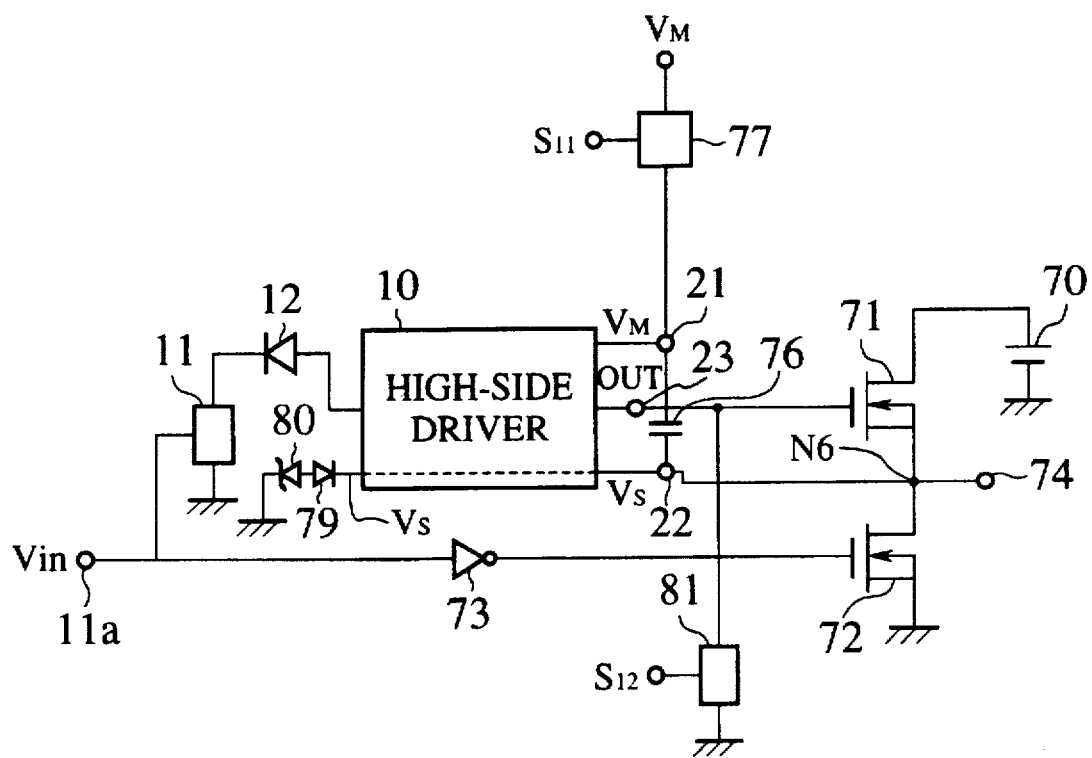
FIG. 9 is a diagram showing the outline of a half bridge circuit according to a second embodiment of the invention.
Figure 10:
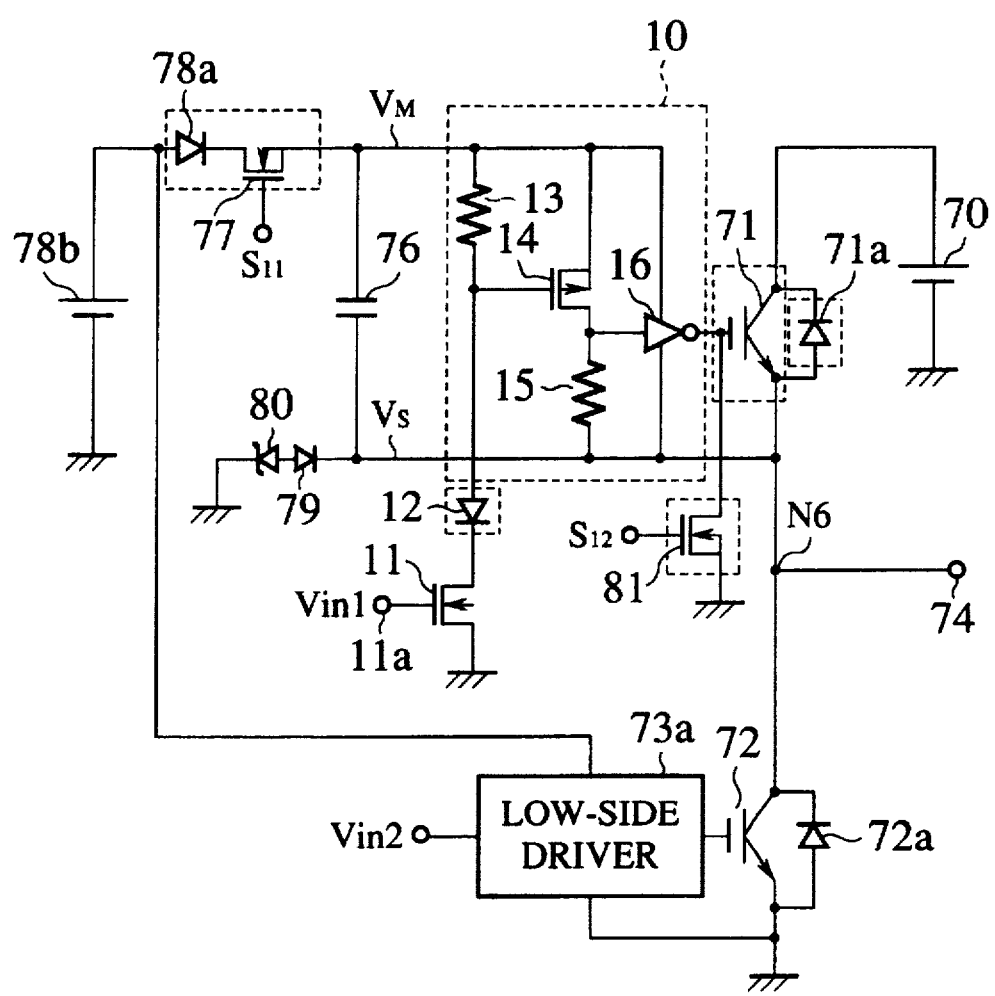
FIG. 10 is a diagram showing a particular circuit arrangement of another half bridge circuit according to the second embodiment of the invention.

FIG. 9 is a diagram showing the outline of a half bridge circuit according to the second embodiment of the invention, and FIG. 10 shows another half bridge circuit according to the second embodiment of the invention, the circuit being more detailed than that of FIG. 9.

The half bridge circuit shown in FIG. 9 has first and second output elements 71 and 72 of n-channel MOSFET which are serially connected between a power source 70 and a ground GND via a center node N6. Specifically, the drain of the first output element 71 is connected to the power source 70 and the source thereof is connected to the center node N6, whereas the drain of the second output element 72 is connected via the center node N6 to the source of the first output element 71 and the source thereof is connected to the ground GND.

An output "Out" 23 of the high-side driver circuit 10 formed in an active region isolated from other circuits by dielectric isolation is applied to the gate of the first output element 71, and a reference potential $V_S$ is supplied to the center node N6. The high-side driver circuit 10 used in the second embodiment of the invention may employ the same DI structure and circuit configuration as that of the first embodiment described with FIGS. 4 and 5, and FIGS. 6A to 6G. Therefore, the high-side driver circuit 10 of the second embodiment of the invention is connected to the switching element 11 via the reverse current preventing diode 12. In FIG. 9, an input terminal 11a is connected to the switching element 11 and to the input side of an inverter circuit 73 whose output is applied to the gate of the second output element 72. An output terminal 74 is connected to the center node N6, and a load is designed to be connected to the output terminal. A capacitor 76 is connected between a power supply potential $V_M$ terminal 21 and a reference potential $V_S$ terminal 22 of the high-side driver circuit 10. The power supply potential $V_M$ terminal 21 is connected via a first switching element 77 to a power source $V_M$, and the reference potential $V_S$ line is connected to the ground GND via a diode 79 and a Zener diode 80. A second switching element 81 of n-channel MOSFET is connected between the gate of the n-channel MOSFET 71 and the ground. The first and second switching elements 77 and 81 constitute negative potential setting means for disconnecting the high-side driver circuit from the power source $V_M$ and lowering the potential of the circuit by making it enter the floating state, and setting the reference potential $V_S$ line to a negative potential.

With this half bridge circuit, during a normal state, i.e., during a conductive state of the first output element 71, a signal S11 of "H" level is applied to the gate of the first switching element 77 and a signal S12 of "L" level is applied to the gate of the second switching element 81, so that the first switching element 71 is in an on-state and the second switching element 81 is in an off-state. Therefore, during the normal state, the capacitor 76 is charged by the power source $V_M$.

In this state, as an input signal Vin of "H" level is applied to the input terminal 11a and the high-side drive circuit 10 outputs a signal "Out", the first output element 71 of n-channel MOSFET turns on. Since the output of the inverter circuit 73 is "L" level, the second output element 72 of n-channel MOSFET is in an off-state. Therefore, "H" level is output from the output terminal 74.

Conversely, as an input signal Vin of "L" level is applied to the input terminal 11a, the high-side drive circuit 10 becomes disabled and the signal "Out" is "L" level.

Therefore, the first output element 71 turns off. In this case, since the inverter circuit 73 inverts the input signal Vin of "L" level and outputs "H" level. Therefore, the second output element 72 turns on and "L" level is output from the output terminal 74.

If it is assumed that an inductive load is connected to the output terminal 74, in order to turn off the first output element 71 and turn on the second output element 72 at high speed, it becomes necessary, similar to the first embodiment, to set the reference potential $V_S$ of the high-side driver circuit 10 to a negative potential and attenuate the electrical energy in the load quickly. To this end, first, the signal S11 is set to "L" level to turn off the first switching element 77 so that a supply of energy from the power source $V_M$ to the power source $V_M$ line is stopped and the high-side driver circuit is made to be in a floating state. Next, the signal S12 is set to "H" level to turn on the second switching element 81 so that a parasitic capacitor between the gate and source of the n-channel MOSFET 71 is discharged quickly. At the same time, the potential of the high-side driver circuit 10 is lowered to discharge negative charges from the capacitor 76. As a result, the reference potential $V_S$ line takes a negative potential in a spike manner and the electrical energy in the load can be attenuated quickly.

Similar to the first embodiment, also in the second embodiment of the invention, the reference potential $V_S$ of the high-side driver circuit 10 can be set to a negative potential without influencing other circuit elements in a same semiconductor chip. This is because, in the second embodiment of the invention, the high-side driver circuit 10 and reverse current preventing diode 12 are isolated by DI technology and each semiconductor active region can well be isolated irrespective of the bias conditions. Further, since the current path from the ground GND to the reference potential $V_S$ line can be disconnected by the reverse current preventing diode, it is easy to set to the reference potential $V_S$ to a negative potential.

FIG. 10 is a detailed circuit diagram of another half bridge having two input configuration according to the second embodiment of the invention. In FIG. 10, like elements to those shown in FIGS. 4 and 9 are represented by using identical reference numerals. As different from the circuit shown in FIG. 9, this half bridge circuit uses an IGBT as first and second output elements 71 and 72, and clamping diodes 71a and 72a are connected to the output elements 71, and 72 in parallel. In addition, a capacitor 76 is connected between the power supply potential $V_M$ line and reference potential $V_S$ line. The power supply potential $V_M$ line is connected to a power source 78b via a first switching element 77 of n-channel MOSFET and a diode 78a sequentially connected. The reference potential $V_S$ line is connected to the ground GND via a diode 79 and a Zener diode 80 respectively reversely connected. A second switching element 81 of n-channel MOSFET is connected between the gate of IGBT 71 and the ground GND. The first and second switching elements 77 and 81 constitute negative potential setting means for disconnecting the high-side driver circuit from the power source 78b and lowering the whole potential of the driver circuit 10 by making it enter the floating state, and setting the reference potential $V_S$ line on the driver circuit 10 to a negative potential. In place of the inverter circuit 73 shown in FIG. 9, in the circuit shown in FIG. 10, a low-side driver circuit 73a to be driven by a second input signal Vin2 is used and an output of this circuit 73a is applied to the gate of the output element 72.

With this half bridge circuit, normally, a signal S11 of "H" level is applied to the gate of the first switching element 77 and a signal S12 of "L" level is applied to the gate of the second switching element 81, so that the first switching element 77 in an on-state and the second switching element 81 is in an off-state. Therefore, during this the normal state, the capacitor 76 is charged by the power source 78b. In this state, as a first turn-on input signal Vin1 is applied to the input terminal 11a, the high-side drive circuit 10 enters an active state so that the first output element 71 turns on and current flows from the power source 70 to a load connected to the output terminal 74. At this time, the low-side driver circuit 73a is input with a turn-off second input signal Vin2 so that the second output element 72 is in an off-state.

Conversely, as a first turn-off input signal Vin is applied to the input terminal 11a, the high-side drive circuit 10 enters a disabled state so that IGBT 71 turns off and a current supply from the power source 70 to the load is stopped. At this time, the low-side driver circuit 73a is input with a turn-off second input signal Vin2 so that the second output element 72 is in an on-state. As a result, the output terminal 74 becomes "L" level. Similar to the first embodiment of the invention, in order to turn off the first output element 71 at high speed, the reference potential $V_S$ of the high-side driver circuit 10 is set to a negative potential and the electrical energy in the load is attenuated quickly. To this end, in the second embodiment of the invention, the signal S11 is set to "L" level to turn off the first switching element 77 so that a supply of energy from the power source 78b to the power source $V_M$ line is stopped and the high-side driver circuit is made to be in a floating state. Next, the signal S12 is set to "H" level to turn on the second switching element 81 so that a parasitic capacitor between the gate and source of IGBT 71 is discharged quickly. At the same time, the whole potential of the high-side driver circuit 10 is lowered by the second switching element 81. As a result, the reference potential $V_S$ line is set capacitively to a negative potential in a spike manner, as a result of the charges in the capacitor 76.

In the half bridge circuit of the second embodiment of the invention, when the output element 71 changes from a turn-on state to a turn-off state, i.e., when the current supply to the load is stopped, the energy stored in the load can be attenuated quickly. Specifically, as described with the first embodiment, in order to turn off the output element 71 at high speed, the energy in the load is required to be attenuated quickly. Similar to the first embodiment, also in the second embodiment of the invention, it is possible to set the reference potential $V_S$ of the high-side driver circuit 10 to a negative potential without influencing other circuit elements formed on a same supporting substrate. This is because, in the second embodiment of the invention, the high-side driver circuit 10 and reverse current preventing diode 12 are isolated by DI structure and each semiconductor active region can well be isolated irrespective of the bias conditions. Further, since the current path from the ground GND to the reference potential $V_S$ line can be disconnected by the reverse current preventing diode, it is easy to set to the reference potential $V_S$ to a negative potential level. According to the second embodiment of the invention, it is therefore possible to attenuate the energy in the load quickly and realize a high speed operation.

In the half bridge circuit of the second embodiment of the invention, if the elements of a monolithic power IC formed over the same supporting substrate are three elements including the high-side driver circuit 10, switching element 11, and reverse current preventing diode 12, it is sufficient at least two elements are isolated from the remaining one element by DI technology. With this arrangement, even if the reference potential $V_S$ line is set to a negative potential lower than the ground GND, parasitic elements do not operate or a current path will not be formed from the ground GND to the reference potential $V_S$ line. Therefore, the reference potential $V_S$ line can be lowered down to the breakdown voltage of the reverse current preventing diode 12. Therefore, according to the second embodiment of the invention, it is preferable to surround at least two elements among the three elements by a dielectric member. This is due to the fact that the elements other than the above-described three elements are formed on the same supporting substrate in a general power IC, and therefore an influence of a potential change of the high-side driver circuit upon the other elements is required to be taken into consideration. Namely, the potential of the high-side driver circuit 10 under operation of the semiconductor device of the second embodiment of the invention, changes approximately between $V_M$ and $V_S$ and the reverse current preventing diode 12 is not directly connected to the ground GND. Therefore, the potential change range of the high-side driver circuit 10 is broader than the switching element 11. Accordingly, in the second embodiment of the invention, of these three elements, if the two elements (the high-side driver circuit 10 and reverse current preventing diode 12) are respectively isolated by DI structure, the operations of the elements other than the three elements constituting the power IC can be normalized most efficiently. In addition to this effect, by omitting the DI region surrounding the other active regions, the area efficiency can be improved correspondingly so that the total chip area of the power IC can be reduced.

Further, depending upon the design specification of the half bridge circuit, as indicated broken lines in FIG. 10, the first switching element 77 and the diode 78a may be surrounded by a dielectric member, or the first output element 71, clamping diode 71a, and second switching element 81 may be surrounded by a dielectric member. Such a design may be determined in accordance with the requested stability, switching speed, drive power, and the like.

Various modifications will become possible for those skilled in the art after receiving the teachings of the present disclosure without departing from the scope thereof.

What is claimed is:

1. A power IC comprising:
   (a) first to third semiconductor active regions;
   (b) a level shifter comprising a switching element formed in said first semiconductor active region for changing the level of an input signal;
   (c) a driver circuit formed in said second semiconductor active region for driving a predetermined output element in accordance with a level changed by said level shifter, said driver circuit having a reference potential line whose potential can swing between two levels, a power supply line connected to a first power source, and an output terminal connected to a control electrode terminal of the output element; and
   (d) a reverse current preventing diode formed in said third semiconductor active region and connected between said level shifter and said driver circuit;
   wherein at least two regions among said first to third semiconductor active regions are dielectrically isolated from the remaining one region, and said second semiconductor active region is made to be a floating structure whose potential level changes according to the swing of said reference potential line.

2. The power IC of claim 1, wherein said first and third semiconductor active regions are both dielectrically isolated.

3. The power IC of claim 1, wherein said first to third semiconductor active regions are all dielectrically isolated.

4. The power IC of claim 1, wherein said level shifter includes first and second level shifters for changing the levels of first and second input signals, and said driver circuit latches the levels changed by said first and second level shifters and drives the predetermined load.

5. The power IC of claim 1 wherein said switching element in the level shifter has a control electrode to receive said input signal.

6. The power IC of claim 1, wherein said switching element in the level shifter is one of a group of devices comprising a MOSFET, an IGBT, a bipolar transistor and a thyristor.

7. The power IC of claim 1, wherein the dielectric isolation is achieved by dielectric regions formed on the side and bottom of two regions among said first to third semiconductor active regions.

8. A power IC comprising:
(a) first to fourth semiconductor active regions;
(b) a level shifter formed in said first semiconductor active region for changing the level of an input signal;
(c) a driver circuit formed in said second semiconductor active region for driving a predetermined load in accordance with a level changed by said level shifter, said driver circuit having a reference potential line, a power supply line connected to a first power source, and an output terminal;
(d) a reverse current preventing diode formed in said third semiconductor active region and connected between said level shifter and said driver circuit; and
(e) an output element formed in said fourth semiconductor active region and having a first main electrode terminal connected to a second power source, a second main electrode terminal connected to a load, and a control electrode terminal,
wherein an output of said driver circuit is connected to said control electrode terminal, the reference potential line of said driver circuit is connected to said second main electrode terminal, at least two regions among said first to third semiconductor active regions are dielectrically isolated from the remaining one region, and said second semiconductor active region is made to be of a floating structure.

9. The power IC of claim 8, wherein the dielectric isolation is achieved by dielectric regions formed on the side and bottom of two regions among said first to third semiconductor active regions.

10. The power IC of claim 8, wherein said level shifter includes first and second level shifters for changing the levels of first and second input signals, and said driver circuit latches the levels changed by said first and second level shifters and drives the predetermined load.

11. The power IC of claim 8, further comprising negative potential setting means for setting the reference potential line of said driver circuit to a negative potential when said output element is turned off.

12. The power IC of claim 11, wherein said negative potential setting means includes a first switching element connected between said first power source and said power source line, a second switching element connected between said control electrode terminal and a ground potential, and a capacitor connected between said power source line and said reference potential line.

13. The power IC of claim 12, wherein said fourth semiconductor active region is dielectrically isolated from the other semiconductor active regions, and said first and second switching elements are respectively formed in each semiconductor active region dielectrically isolated from the other semiconductor active regions.

14. A power IC comprising:
(a) first to fifth semiconductor active regions;
(b) a level shifter formed in said first semiconductor active region and having an input terminal for receiving a first input signal;
(c) a first driver circuit formed in said second semiconductor active region for driving a predetermined load in accordance with a level changed by said level shifter, said driver circuit having a reference potential line, a power supply line connected to a first power source, and an output terminal;
(d) a reverse current preventing diode formed in said third semiconductor active region and connected between said level shifter and said first driver circuit;
(e) a high-side output element formed in said fourth semiconductor active region and having a first main electrode terminal connected to a second power source, a second main electrode terminal, and a first control electrode terminal;
(f) a low-side output element formed in said fifth semiconductor active region and having a third main electrode terminal connected to said second main electrode terminal, a fourth main electrode terminal, and a second control electrode terminal; and
(g) a second driver circuit connected to said second control electrode,
wherein an output of said first driver circuit is connected to said first control electrode terminal, the reference potential line of said first driver circuit is connected to said second main electrode terminal, at least two regions among said first to third semiconductor active regions are dielectrically isolated from the remaining one region, and said second semiconductor active region is made to be of a floating structure.

15. The power IC of claim 14, wherein said second driver circuit is an inverter circuit having an input terminal connected to the input terminal of said level shifter and an output terminal connected to said second control electrode terminal.

16. The power IC of claim 14, wherein said second driver circuit is controlled by a second input signal different from said first input signal.

17. The power IC of claim 14, further comprising negative potential setting means for setting the reference potential line of said first driver circuit to a negative potential when said high-side output element is turned off.

18. The power IC of claim 17, wherein said negative potential setting means includes a first switching element connected between said first power source and said power source line, a second switching element connected between said control electrode terminal and a ground potential, and a capacitor connected between said power source line and said reference potential line.

19. The power IC of claim 18, wherein said fourth semiconductor active region is dielectrically isolated from the other semiconductor active regions, and said first and second switching elements are respectively formed in each semiconductor active region dielectrically isolated from the other semiconductor active regions.

20. The power IC of claim 14, wherein said level shifter includes first and second level shifters for changing the levels of first and second input signals, and said first driver circuit latches the levels changed by said first and second level shifters and drives the predetermined load.

21. The power IC of claim 14, wherein the dielectric isolation is achieved by dielectric regions formed on the side and bottom of two regions among said first to third semiconductor active regions.

22. The power IC of claim 14, wherein said reference potential line is connected to a ground line via a diode and a Zener diode respectively reversely connected.

* * * * *

UNITED STATES PATENT AND TRADEMARK OFFICE
CERTIFICATE OF CORRECTION

PATENT NO. : 5,767,562
DATED : June 16, 1998
INVENTOR(S) : YAMASHITA

It is certified that error appears in the above-indentified patent and that said Letters Patent is hereby corrected as shown below:

Claim 1, column 14, lines 63-64, after "structure", insert --,--.

Claim 5, column 15, line 8, after "claim 1", insert --,--.

Signed and Sealed this

Sixteenth Day of March, 1999

Attest:

Q. TODD DICKINSON

Attesting Officer

Acting Commissioner of Patents and Trademarks